(12) United States Patent
Charvet

(10) Patent No.: US 8,524,520 B2
(45) Date of Patent: Sep. 3, 2013

(54) METHOD FOR PRODUCING A STRUCTURE COMPRISING A MOBILE ELEMENT BY MEANS OF A HETEROGENEOUS SACRIFICIAL LAYER

(75) Inventor: Pierre-Louis Charvet, Saint-Martin-le-Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 538 days.

(21) Appl. No.: 12/457,333

(22) Filed: Jun. 8, 2009

(65) Prior Publication Data
US 2009/0317930 A1 Dec. 24, 2009

(30) Foreign Application Priority Data

Jun. 23, 2008 (FR) ...................................... 08 03503

(51) Int. Cl.
*H01L 21/00* (2006.01)
(52) U.S. Cl.
USPC ................. 438/52; 438/704; 216/11; 216/74; 257/E21.219; 257/E29.324
(58) Field of Classification Search
USPC ............... 438/48, 52, 53, 619, 704, 706, 722, 438/723, 724, 725, 742, 743, 744; 216/11, 216/73, 74; 257/E29.324, E21.218, E21.219
See application file for complete search history.

(56) References Cited

U.S. PATENT DOCUMENTS

| 5,638,946 | A | * | 6/1997 | Zavracky | 200/181 |
|---|---|---|---|---|---|
| 6,020,215 | A | * | 2/2000 | Yagi et al. | 438/52 |
| 7,064,637 | B2 | * | 6/2006 | Tactic-Lucic et al. | 335/78 |
| 7,342,710 | B2 | * | 3/2008 | Kim et al. | 359/290 |
| 7,625,825 | B2 | * | 12/2009 | Chan | 438/720 |
| 7,642,612 | B2 | * | 1/2010 | Izumi et al. | 257/415 |
| 2002/0015853 | A1 | * | 2/2002 | Wataya et al. | 428/469 |
| 2006/0138076 | A1 | | 6/2006 | Robert et al. | |
| 2007/0138582 | A1 | | 6/2007 | Nystrom et al. | |
| 2008/0278788 | A1 | * | 11/2008 | Sasagawa | 359/224 |
| 2009/0092862 | A1 | * | 4/2009 | Morris et al. | 429/9 |

* cited by examiner

*Primary Examiner* — William D Coleman
*Assistant Examiner* — Su Kim
(74) *Attorney, Agent, or Firm* — Oliff & Berridge, PLC

(57) ABSTRACT

First and second sacrificial materials are deposited on a substrate. The first and second patterns are respectively formed in the first and second sacrificial materials. The first pattern made from the first sacrificial material is arranged on the second pattern made from a second sacrificial material. The first pattern leaves an area of predefined width free on the periphery of a top surface of the second pattern. The active layer covers at least the whole of the side walls of the first and second patterns and said predefined area of the second pattern. The active area is patterned so as to allow access to the first sacrificial material. The first and second sacrificial materials are selectively removed forming a mobile structure comprising a free area secured to the substrate by a securing area.

16 Claims, 6 Drawing Sheets

METHOD FOR PRODUCING A STRUCTURE COMPRISING A MOBILE ELEMENT BY MEANS OF A HETEROGENEOUS SACRIFICIAL LAYER

BACKGROUND OF THE INVENTION

The invention relates to a method for producing a structure on a substrate, comprising at least one mobile element presenting a free area secured to the substrate by a securing area, the mobile structure being formed by at least one active layer, the method successively comprising deposition and patterning of a first sacrificial material to form a first pattern of first sacrificial material, deposition of the active layer and patterning of the latter to allow access to the first sacrificial material, and removal of the first sacrificial material releasing the free area of the active layer.

STATE OF THE ART

Many integrated micro electro mechanical systems (MEMS) comprise flat suspended microstructures. This is for example the case of suspended actuators, sensors, switches, variable capacitors, self-inductors or acoustic wave resonators. In microtechnology or microelectronics, suspended microstructures are produced using a sacrificial layer. The conventional steps for obtaining a suspended microstructure are described in U.S. patent application Ser. No. 10/536,890 and are represented in simplified form in FIGS. 1 to 5.

In a first step represented in FIG. 1, a layer 2 of sacrificial material is deposited on a substrate 1. Layer 2 is typically made of polymer material, silicon oxide or tungsten. The second step, represented in FIG. 2, consists in lithographing and etching layer 2 so as to form a sacrificial material pattern 2a, the pattern covering a part of substrate 1 on which the suspended structure is to be formed. Then, in a third step represented in FIG. 3, an active layer 3 which forms the suspended structure is deposited on substrate 1 and on sacrificial material pattern 2a. Active layer 3 can be conducting or dielectric or formed by a stack of several different layers. The fourth step, represented in FIG. 4, consists in lithographing and etching active layer 3 up to the level of the front surface of sacrificial layer 2 so as to delineate suspended structure 5 by openings 4 in active layer 3. In a fifth step, represented in FIG. 5, the sacrificial layer is removed by dry etching or wet etching so as to constitute a free space between the substrate and suspended structure 5, thereby releasing the suspended structure.

The sacrificial material forming pattern 2a is chosen such that etching thereof is selective with respect to the material from which the microstructure is made. For example, sacrificial layer 2 can be made from silicon oxide ($SiO_2$) and the suspended structure can be made from polysilicon. A second combination comprises a sacrificial layer of polymer material and a suspended structure made from $SiO_2$. A third possibility consists in using a sacrificial layer of polymer material and a suspended structure made from metal. The use of a sacrificial layer that is removed by wet etching, for example $SiO_2$ in a hydrofluoric acid-base (HF) chemical bath, gives rise to problems of bonding of the structures when the releasing step is performed. It can easily be noted that producing a device mainly involves the choice of materials composing the latter and the problems relating to deposition and especially to selective removal of these materials.

Microsystems are conventionally made not from a single material but from a plurality of materials that play very precise roles and that are selected according to their specific chemical, mechanical or electrical features. This results in selective removal of the sacrificial layer having to be performed by means of an etching method that has to be selective with respect to all the materials in contact with the sacrificial layer or that present a free surface, which greatly limits design possibilities. Certain architectures then become impossible to achieve on account of the complexity of their fabrication methods.

OBJECT OF THE INVENTION

The object of the invention is to alleviate the constraints incumbent on the production steps of a device comprising a mobile structure released by removal of a sacrificial material.

The method according to the invention is characterized in that, before deposition of the first sacrificial material, it comprises deposition of a second sacrificial material, and formation of a second pattern in the second sacrificial material after formation of the first pattern, so that the first pattern of first sacrificial material being arranged on the second pattern made from a second sacrificial material, the first pattern leaves an area of predefined width free at the periphery of a top surface of the second pattern, the active layer covering at least the whole of the side walls of the first and second patterns and said area of predefined width of the second pattern, and that it comprises removal of the second sacrificial material after the first sacrificial material has been removed.

BRIEF DESCRIPTION OF THE DRAWINGS

Other advantages and features will become more clearly apparent from the following description of particular embodiments of the invention given for non-restrictive example purposes only and represented in the appended drawings in which.

DESCRIPTION OF A PREFERRED EMBODIMENT OF THE INVENTION

Figure 1:
FIGS. 1 to 5 schematically represent, in cross-section, the main steps of producing a suspended structure comprising a free area obtained in a particular embodiment of the method according to the prior art, FIGS. 6 to 8, 10, 11, 13 and 14 schematically represent, in cross-section, the main steps of producing a suspended structure comprising a free area obtained in a particular embodiment of the method according to the invention, FIGS. 9 and 12 schematically represent, in top view, the steps of the method respectively illustrated by FIGS. 8 and 11, FIGS. 15 to 20 schematically represent, in cross-section, an alternative embodiment of a suspended structure comprising a free area obtained by the method according to the invention.
Figure 2:
Figure 3:
Figure 4:
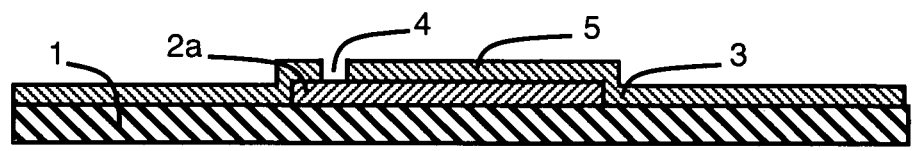
Figure 5:
Figure 6:
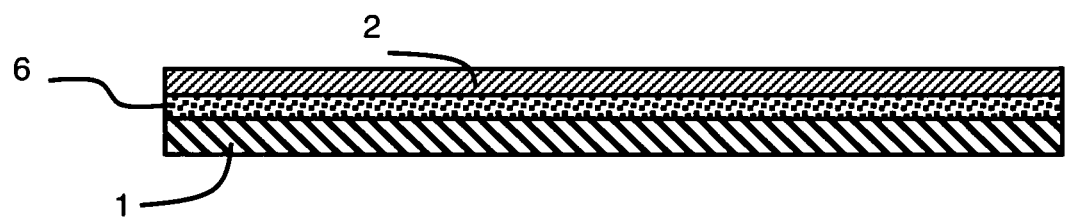
Figure 7:
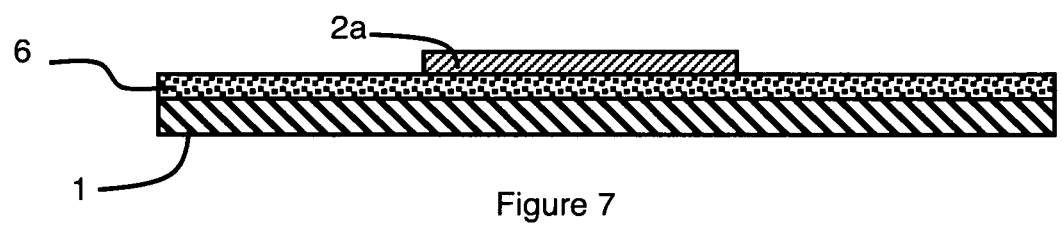

As illustrated in FIGS. 6 and 7, first and second sacrificial materials 2 and 6 are deposited on a substrate 1. Second sacrificial material 6 is arranged between substrate 1 and first sacrificial material 2. The layer of first sacrificial material 2 is patterned in conventional manner, for example by photolithography and etching so as to form a predetermined first sacrificial pattern 2a. Etching of the first sacrificial material is performed selectively with respect to the layer of second sacrificial material 6. The top surface of layer 2 is substantially parallel to the surface of substrate 1. The layers of first and second sacrificial materials 2 and 6 are patterned by chemistries of different etchings.

Figure 8:
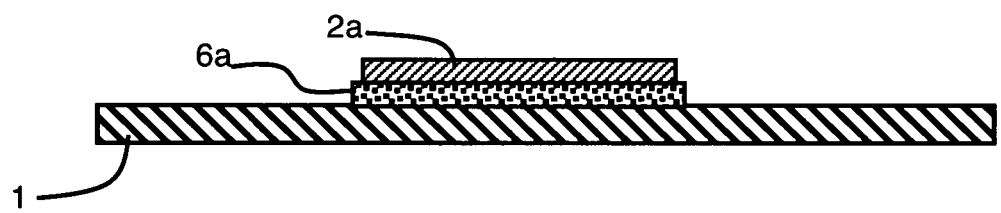

As illustrated in FIG. 8, second sacrificial material 6 is then patterned selectively with respect to first sacrificial material 2 and to substrate 1 to form a second sacrificial pattern 6a of the second sacrificial material. Second sacrificial pattern 6a is slightly larger than first sacrificial pattern 2a of the first sacrificial material. Etching of the second sacrificial material can be performed by means of new photolithography and etching steps. At this stage of production, first and second sacrificial materials 2 and 6 have been patterned to respectively form first and second sacrificial patterns 2a and 6a on substrate 1. First pattern 2a leaves an area of predefined width free on the top surface of second pattern 6a, at the periphery of the second pattern. Thus, in a top view illustrated in FIG. 9, sacrificial layers 2 and 6 and substrate 1 are visible and second sacrificial pattern 6a is visible continuously around first sacrificial pattern 2a.

Advantageously, the difference of size between two consecutive patterns of sacrificial materials, here 2a and 6a, is related to the targeted applications. This size difference corresponds to a clearance width and length necessary for an etching agent not to overflow onto the side walls of the bottom sacrificial pattern. Thus, to produce a mobile structure such as a micro-mechanical beam or membrane, this clearance distance is about a few micrometers. For a nanometric beam or membrane, this distance is about a few nanometers. The clearance distance also depends on the thickness of the bottom patterns, here 6a, on the etching time and on the etching agents used.

The number of sacrificial layers used in fabrication for example of a micro-mechanical or microelectronic structure comprising a free area depends on the complexity of the structure to be produced. The sacrificial layers enable the different elements constituting the structure (electrodes, air gaps, interconnects, resistors, insulating layers, etc.) to be patterned. Each sacrificial layer can thereby enable patterning of all or part of at least one element of the structure to be formed.

In general manner, in the case of a sacrificial stack of several layers of sacrificial materials, the materials forming the sacrificial stack are selected such that the top layer of the stack, the top sacrificial pattern, can be removed selectively with respect to the layer immediately underneath.

Figure 9:
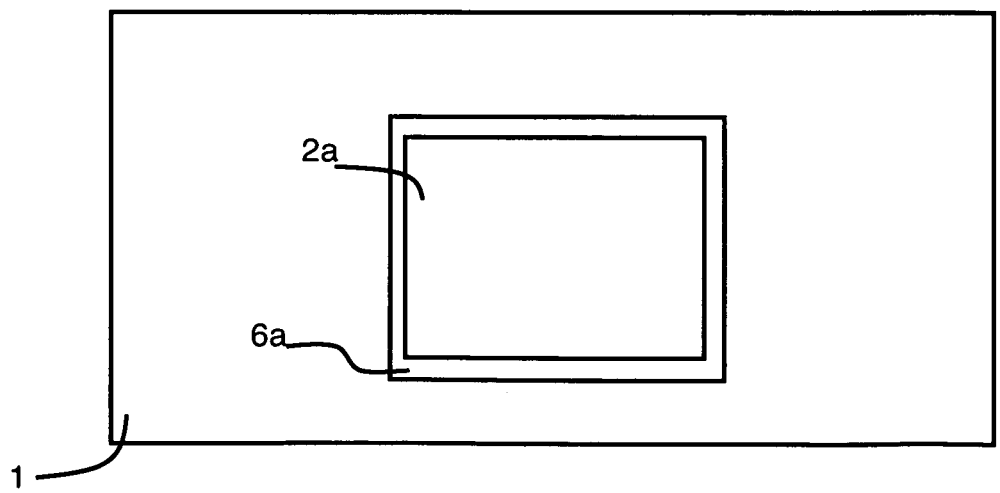

Furthermore, a layer of the stack occupies a slightly smaller surface than the sacrificial layer on which it is deposited and leaves an area of predefined width of the top surface of the sacrificial layer immediately underneath free, at the periphery of the latter as illustrated in FIG. 9 with patterns 2a and 6a.

The use of superposed sacrificial layers thereby enables the constraints with respect to the choice of materials of the technological stack of the fabricated structure to be relaxed. A larger choice of materials is thereby possible and each material can be used several times in the stack. This method can furthermore be used in all cases whether the substrate is electrically conducting or not.

Figure 10:
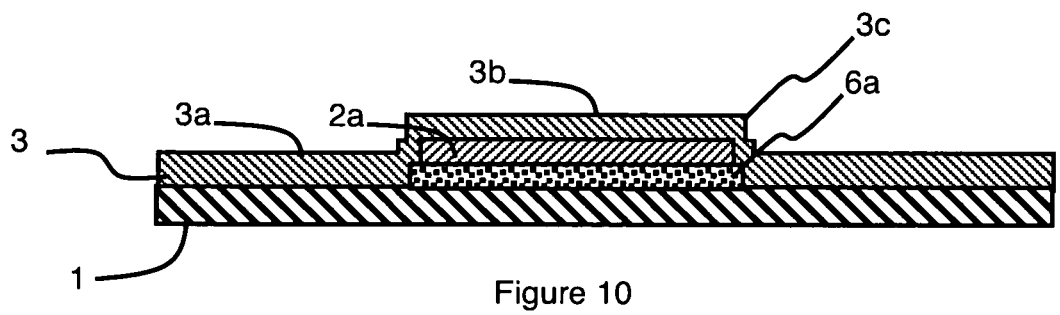
Figure 11:
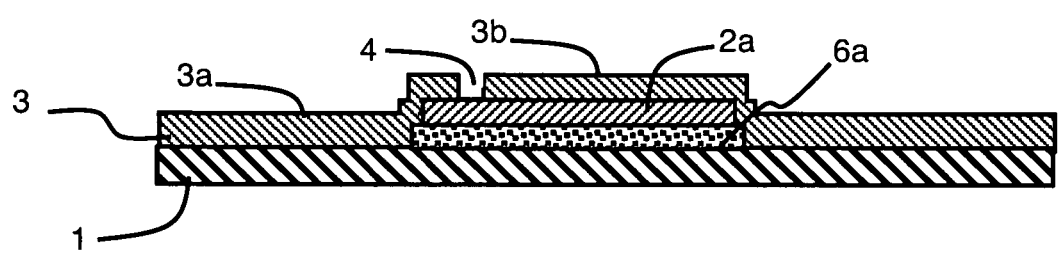

As illustrated in FIGS. 10 and 11, an active layer 3 is then deposited full-wafer on substrate 1 and covers first and second sacrificial patterns 2a and 6a. Active layer 3 then comprises a part deposited directly on substrate 1 and a part deposited on materials 6 and 2. Active layer 3 covers the whole of the external surface of the top sacrificial pattern of the stack of sacrificial materials. Active layer 3 here covers the top surface of first pattern 2a and the side walls thereof. Active layer 3 also covers the top surface of second pattern 6a that was left free and the side walls thereof.

If an additional sacrificial material is used, the latter is deposited above first sacrificial material 2 to form a sacrificial pattern above pattern 2a. In this case, the top surface and side walls of the sacrificial pattern are covered by the active layer and only a peripheral portion and the main walls of first pattern 2a are covered. In general manner, active layer 3 covers the top surface of the sacrificial layer which forms the apex of the pyramid of sacrificial materials. Active layer 3 furthermore also covers the top peripheral surface of all the bottom sacrificial layers and also their side walls.

When deposition thereof is performed, active layer 3 is in direct contact with all the sacrificial layers and substrate 1. This results in first pattern 2a of first sacrificial material being in direct contact with second pattern 6a of second sacrificial material via its bottom surface and in direct contact with active layer 3 via the other surfaces. In like manner, second pattern 6a made from second sacrificial material is in direct contact with first sacrificial material 2 via its top surface. It is also in direct contact with active layer 3 via the periphery of its top surface and via its side walls. Second pattern 6a is also in direct contact with substrate 1 via its bottom surface.

In schematic manner, active layer 3 comprises three areas. First area 3a is arranged directly on substrate 1 and is horizontal in FIG. 9. Second area 3b is arranged on first sacrificial material 2, i.e. on the top sacrificial layer of the stack, and is also horizontal in FIG. 9. Advantageously, areas 3a and 3b are parallel. Third area 3c joins first and second areas 3a and 3b of the active layer and is oblique in FIGS. 10 and 11.

An opening 4 is made in active layer 3, in second area 3b only, so as to only allow access to first pattern 2a of first sacrificial material 2. Opening 4 is made in conventional manner, for example by photolithography and etching. Access to first sacrificial material 2 is thereby possible to be able to remove this material.

Figure 12:
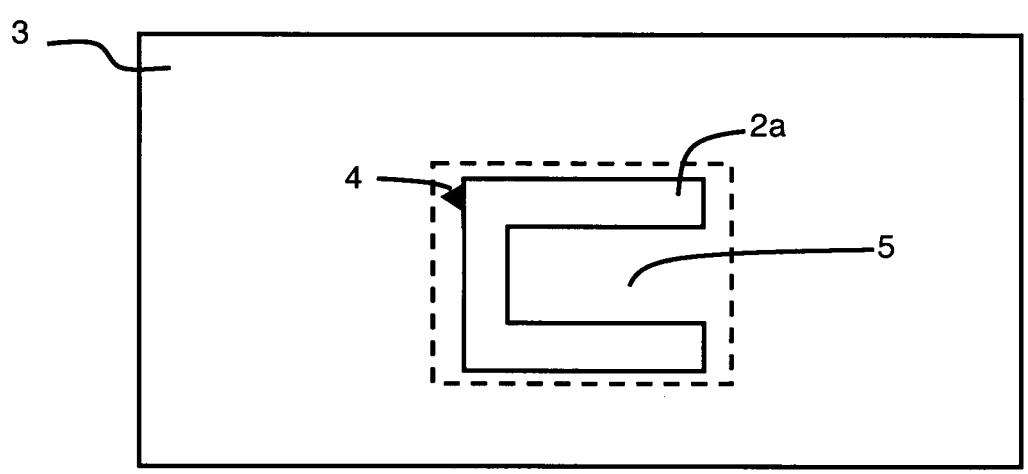

Opening 4 has several functions—mainly it enables access to be had to the sacrificial layer to be removed, but it can also enable at least a part of a pattern of active layer 3 to be defined. As illustrated in FIG. 12, opening 4 is formed in area 3b of layer 4 and at the same time allows access to be had to first sacrificial material 2 and enables the future mobile element 5 of the structure to be defined. Opening 4 is formed above the second sacrificial pattern which is represented by a broken line in FIG. 12.

Figure 13:
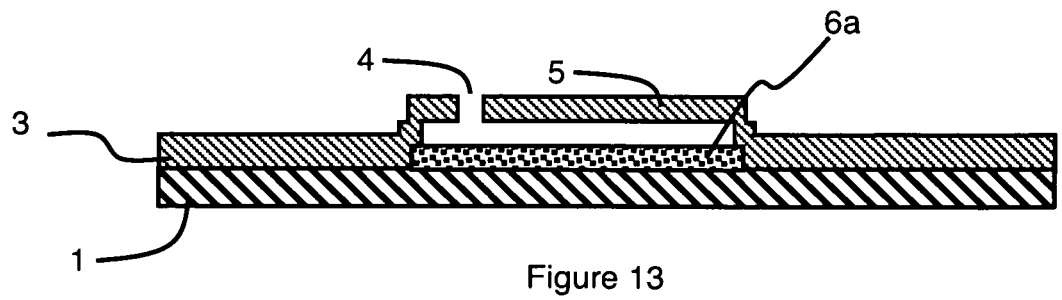
Figure 14:
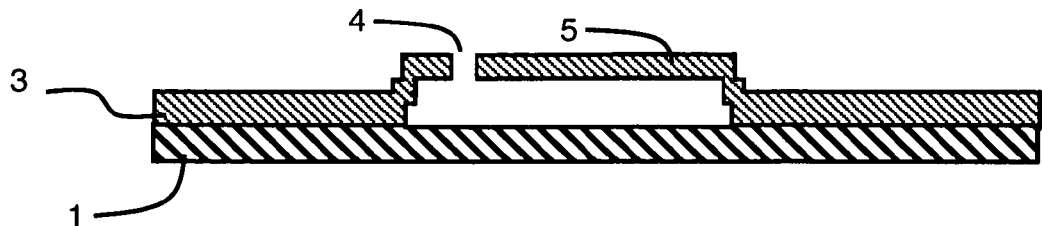

As illustrated in FIGS. 13 and 14, first sacrificial material 2 being accessible, it is removed selectively with respect to the other materials present. As specified above, the first sacrificial material only being in direct contact with second sacrificial material 6 and active layer 3, the etching method only has to be selective with respect to these materials (FIG. 13). Once the first sacrificial material has been removed, second area 3b of active layer 3 is then not supported by the stack of patterns of first and second sacrificial materials 2a and 6a. A void having the dimensions of first pattern 2a now exists. This void is delineated by the second pattern and by the active layer and only communicates with the outside via opening 4.

Active layer 3 then forms at least a part of the structure which comprises a mobile element 5. This mobile element comprises a free area, i.e. a suspended structure, only secured to the substrate by a securing area fixed onto the substrate. The free area is formed in second area 3b of layer 3. Mobile element 5 of active layer 3 is arranged above and at a distance from substrate 1 and is located between opening 4 and the securing area. The securing area is formed by first area 3a and third area 3c of active layer.

Second sacrificial material 6 being accessible, second pattern 6a is removed by means of a method that only has to be selective with respect to substrate 1 and to active layer 3. A similar method is used to selectively etch the different materials which can form the stack of additional sacrificial layers.

The patterns of sacrificial materials 2 and 6 form a structure that is pyramidal in cross-section, which results in the void area, delineated by the active layer, occupying the same volume which is also in the shape of a pyramid.

The use of a method comprising at least two sacrificial materials 2 and 6 not only enables the advantages of each of the layers taken individually to be combined, but also mutually cancels out the shortcomings of the latter, typically the compatibility of the materials in the fabrication method. Indeed, it is possible in this way to selectively etch a first sacrificial pattern 2a which can be identical to the one composing the substrate or to use an etching agent which also etches the substrate or elements which are covered by second sacrificial pattern 6a.

To enable selective etching methods to be obtained, the elements involved in formation of a device comprising a mobile structure are generally formed by different chemical elements.

Conventionally, sacrificial materials 2 and 6 are constituted by different materials which are also different from the materials forming active layer 3. It is however possible for sacrificial materials 2 and 6 to present the same basic constituents.

If sacrificial materials 2 and 6 are constituted by different materials, they can for example be formed by silicon oxide, silicon nitride, silicon in poly-crystalline or amorphous form, or metallic material, for example molybdenum. If sacrificial materials 2 and 6 comprise the same basic constituents, sacrificial materials 2 and 6 are formed for example respectively by silicon oxide obtained by thermal oxidation and by plasma enhanced chemical vapor deposition. Sacrificial materials 2 and 6 can also be made from intrinsic and doped silicon or from silicon-germanium alloy.

Active layer 3 is typically made from metallic material, for example from chromium, gold or a stack of metallic materials. However, active layer 3 can also be made from dielectric materials. If electrostatic actuation of the active layer is sought for, the latter comprises at least a layer of metallic material.

For example, the production method is then particularly advantageous with a first sacrificial material 2 made from silicon oxide deposited by plasma enhanced chemical vapor deposition. This category of silicon oxide presents a higher etching rate than silicon oxide formed thermally during etching by hydrofluoric acid. The thickness of first sacrificial material 2 is typically around a few microns. Second sacrificial material 6 is for example molybdenum having a thickness of about 500 nm. The active layer is for example made from chromium, gold, silicon nitride or a stacking of the latter. Using a silicon oxide as first sacrificial material 2 is particularly advantageous as it enables easy shaping by means of numerous etching or polishing processes. However, silicon oxide is also used as dielectric in integrated circuits, which limits its use in the case of co-integration.

Thus, according to the particular embodiment illustrated in FIGS. 6 to 12, if at its surface the substrate comprises a silicon oxide or a material that doesn't present etching selectivity with respect to silicon oxide, a component of the microsystem type (for example an accelerometer, pressure sensor, resonator, variable capacitor, microswitch, etc.) is produced by means of a sacrificial layer that is at least partially made of silicon oxide. The sacrificial layer is then heterogeneous, i.e. composed of at least two materials which present etching selectivities between one another.

In a privileged embodiment, a protective layer 7 is formed at the surface of substrate 1. This embodiment is particularly advantageous if substrate 1 is made of silicon or of another electrically conducting material. A protective layer of dielectric material is then formed before integration of the device, for example of MEMS type supplied with electric current. For example, the dielectric formed is an oxide, typically a thermally-formed silicon oxide.

Figure 15:
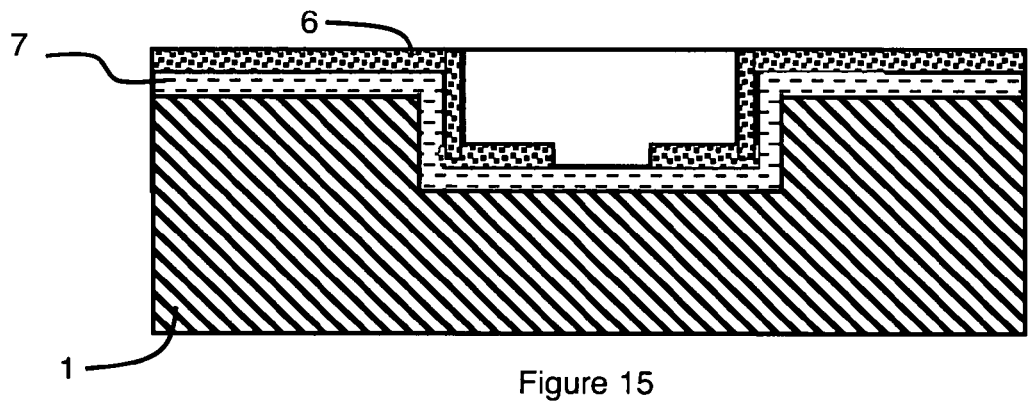

An alternative embodiment is illustrated in FIGS. 15 to 20. This alternative embodiment uses a protective layer, typically a silicon oxide formed thermally on a silicon substrate (FIG. 15). In this embodiment, a depression 8 is formed in silicon substrate 1 before formation of protective layer 7. The depression is a hole which can for example be square, rectangular or circular in shape.

As substrate 1 comprises a silicon oxide at its surface, the different etching methods used to form the structure have to be selective with respect to this silicon oxide.

As illustrated in FIG. 15, second sacrificial material 6 is deposited on protective layer 7 and is patterned so as to leave a predetermined surface of protective layer 7 free in the bottom of depression 8.

A metallic material is then deposited and patterned so as to form a metallic material pattern 9 at the bottom of depression 8. This metallic material pattern 9 covers the whole free surface of protective layer 7 and also overflows onto a portion of second sacrificial material 6. This metallic material pattern 9 is typically an actuation and/or measurement electrode of the structure to be formed.

The metallic material used can be a layer of chromium, gold, a stacking of the latter or any other suitable material.

Figure 16:
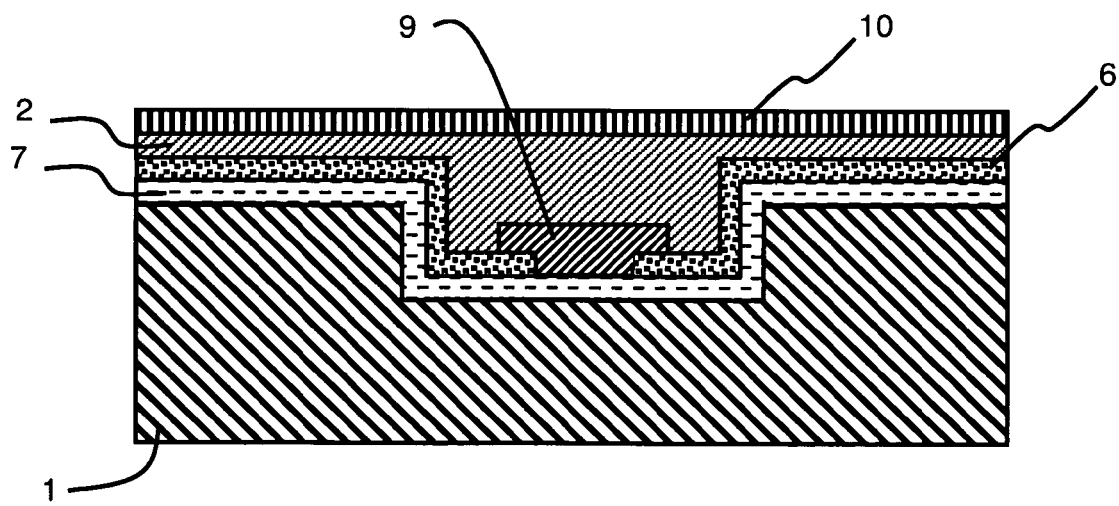

As illustrated in FIG. 16, first sacrificial material 2 and an additional sacrificial material 10 are deposited and cover the surface of the substrate. In conventional manner, a planarization step, for example by chemical mechanical polishing, is performed between deposition of first sacrificial material 2 and deposition of additional sacrificial material 10.

The sacrificial layers used all present an etching selectivity at least with respect to the layer immediately underneath. First sacrificial material 2 and protective layer 7 are sensitive to the same etching agents. For example, first sacrificial material 2 and protective layer 7 are made from the same material, as they are separated by second sacrificial material 6.

For example, first sacrificial material 2 and protective layer 7 are made from silicon oxide respectively formed by plasma enhanced chemical vapor deposition and by thermal oxidation. This results in these two materials 2 and 6 being able to be etched by a hydrofluoric acid solution, by a $CHF_3$ plasma or by a $CHFO_3$ plasma In the same way, second sacrificial material 6 and additional sacrificial material 7 are also made from the same material, for example molybdenum.

The stack of sacrificial materials 2, 6 and 10 thus forms an alternation between silicon oxide and molybdenum in a direction perpendicular to the surface of the substrate.

Advantageously, if several additional sacrificial materials are used, these materials extend this alternation of deposited layers of molybdenum and silicon oxide.

Figure 17:
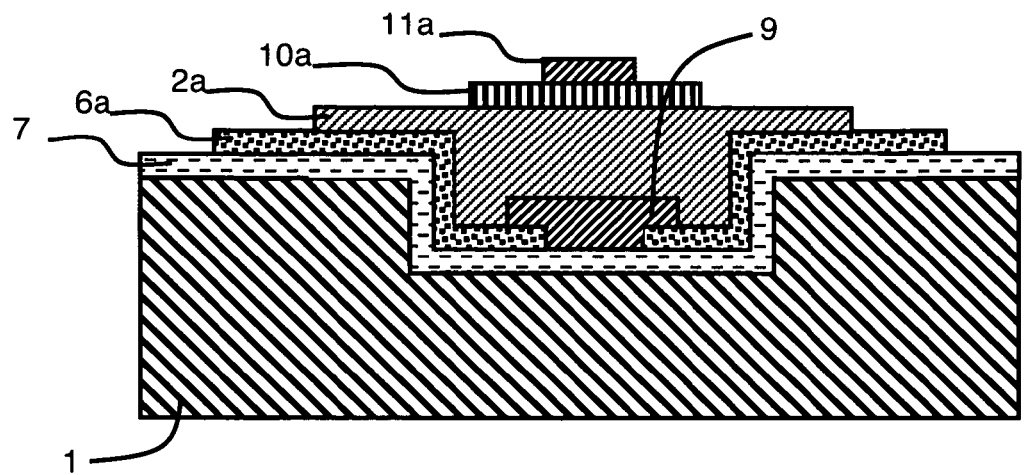

As illustrated in FIG. 17, a second metallic material 11 is deposited on additional sacrificial layer 10 and patterned to form a second metallic pattern 11a. Additional sacrificial layer 10, first dielectric material 2 then second dielectric material 6 are patterned, for example by photolithography and etching, to respectively form additional sacrificial pattern 10a, first sacrificial pattern 2a and second sacrificial pattern 6a. The second metallic material is for example titanium.

These three sacrificial patterns are formed on one another and represent a pyramid. As in the previous embodiment, each of the sacrificial layers is etched independently to form a sacrificial pattern which, seen from above, leaves a part of the periphery of the sacrificial pattern immediately underneath apparent. Each pattern leaves an area of predefined width free at the periphery of a top surface of the pattern immediately underneath.

Figure 18:
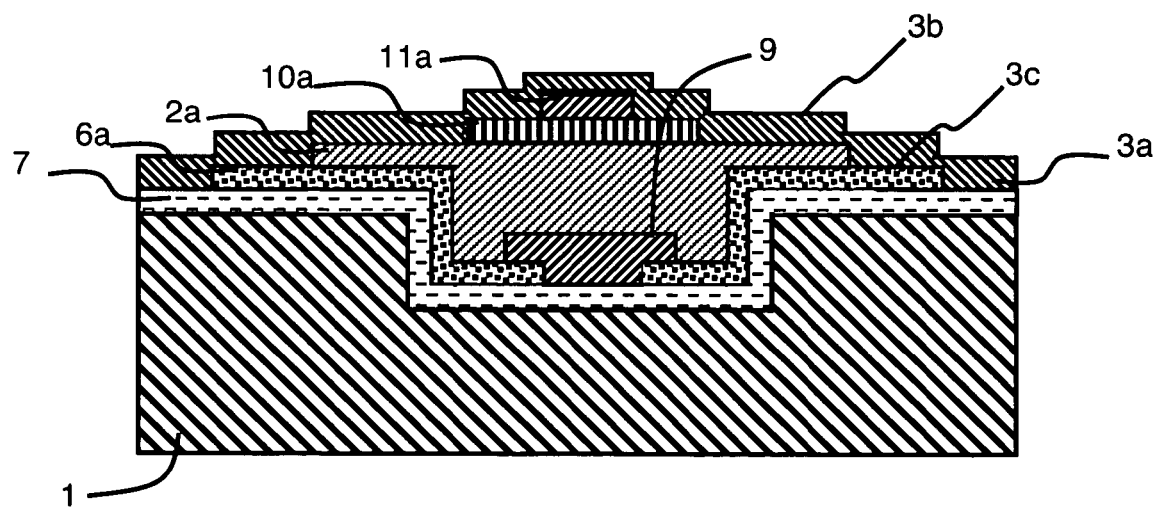
Figure 19:
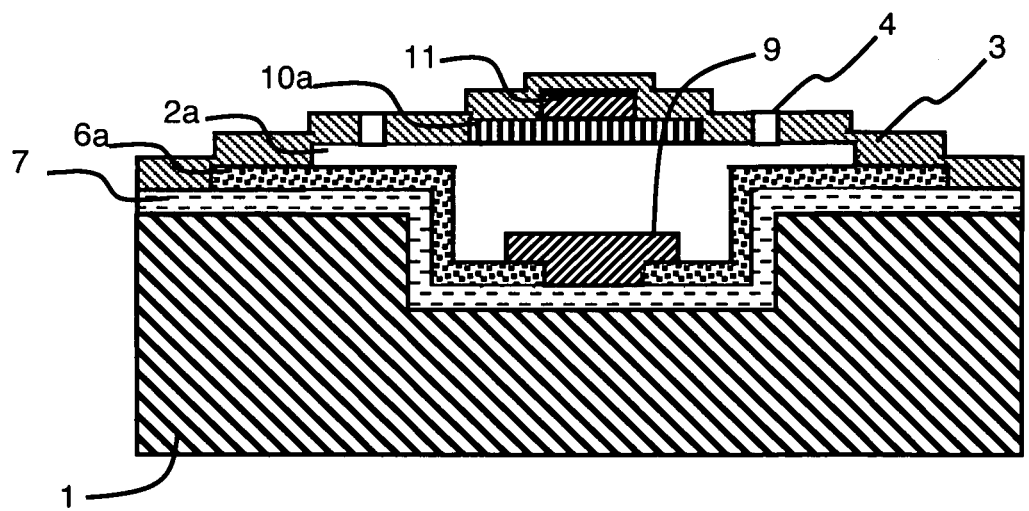

As illustrated in FIG. 18, active layer 3 is formed and covers protective layer 7, first and second sacrificial patterns 2a and 6a, additional sacrificial pattern 10a and second metallic pattern 11a. This active layer 3 is then patterned to form at least one opening 4 allowing access to at least one of the sacrificial materials, as illustrated in FIG. 19. Active layer 3 is for example made from silicon nitride.

Once opening 4 has been formed, first sacrificial material 2 is accessible, and is removed by an etching agent which enables selective etching with respect to second sacrificial material 6 and to additional sacrificial material 10 (FIG. 19).

Figure 20:
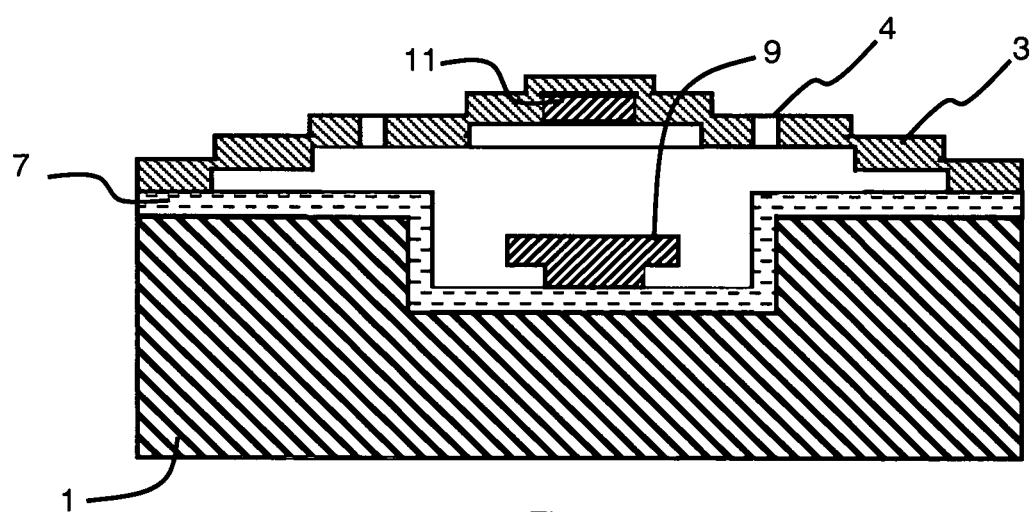

As illustrated in FIG. 20, after first sacrificial material 2 has been removed, the remaining sacrificial materials can be removed selectively or simultaneously depending on the constituents and the etching chemistries used.

In this embodiment, an element of the structure to be produced, here an electrode, is formed between deposition of second sacrificial material 6 and deposition of first sacrificial material 2, i.e. between deposition of two consecutive sacrificial materials. It is however also possible to form an element of the structure between deposition of first sacrificial material 2 and additional sacrificial material 10. This element can moreover for example be a resistor, an interconnect or an insulating element.

In this embodiment, the second metallic material is for example titanium which can be etched by means of hydrofluoric acid in vapor phase. This embodiment is particularly advantageous in the case where the first sacrificial material is made from silicon oxide and the second metallic material is made from titanium. These two materials can in fact be etched by means of hydrofluoric acid in vapor phase. The additional sacrificial pattern and the second sacrificial pattern are made from molybdenum which is not sensitive to hydrofluoric acid.

The invention claimed is:

1. A method for producing a structure on a substrate successively comprising:
   depositing a second sacrificial material;
   depositing a first sacrificial material on the second sacrificial material, the first sacrificial material being different from the second sacrificial material;
   after depositing the second and first sacrificial materials, patterning the first sacrificial material to form a first pad of first sacrificial material and then etching the second sacrificial material to form a second pad of second sacrificial material, so that the first pad of first sacrificial material is arranged on the second pad of second sacrificial material, a design of the first pad being defined smaller than a design of the second pad so as to leave an annular area free on a top surface of the second pad around the first pad;
   depositing an active layer made of a first material on the substrate, on a top surface of the first pad, on the annular area and on side walls of the first pad so as to form a closed cover around the first pad made by the active layer and the second pad over the substrate;
   forming an opening in the active layer to access the first pad;
   removing the first pad selectively versus the second pad material via the opening so as to release a free area of the active layer, the free area being secured to the substrate by a securing area made of the active layer; and
   removing the second pad via the opening after the first pad has been removed.

2. The method according to claim 1, further comprising:
   depositing the second sacrificial material on an additional sacrificial material; and
   patterning the additional sacrificial material after the second sacrificial material so as to form the second pad above one additional sacrificial pad, the second pad leaving an area of predefined width free on a periphery of a top surface of a pad immediately underneath.

3. The method according to claim 1, further comprising forming an electrode between depositing the first and the second sacrificial materials.

4. The method according to claim 3, wherein an element of said structure is chosen from among an electrode, a resistor, an interconnect, and an insulating element.

5. The method according to claim 1, wherein the substrate is covered by a protective layer, the protective layer and the first sacrificial material having same main constituents.

6. The method according to claim 5, wherein the protective layer is made from thermally-formed silicon oxide and the first sacrificial material is made from silicon oxide produced by plasma enhanced chemical vapor deposition.

7. The method according to claim 5, wherein the substrate and the protective layer are sensitive to same etching agents.

8. The method according to claim 7, wherein the protective layer and the first sacrificial material are etched by a hydrofluoric acid solution, by a $CHF_3$ plasma or by a $CHF_3O_2$ plasma.

9. The method according to claim 1, wherein the first sacrificial material is made from $SiO_2$ and the second sacrificial material is molybdenum.

10. The method according to claim 2, wherein the first pad is made from silicon oxide and another additional sacrificial pad is made from molybdenum, the first pad is immediately underneath the another additional sacrificial pad.

11. The method according to claim 2, wherein the sacrificial materials form an alternation of patterns of molybdenum and of silicon oxide perpendicularly to a surface of the substrate.

12. The method according to claim 1, further comprising:
   patterning the active layer to allow access only to the first sacrificial material, the top surface of the second pad being covered by the active layer and the first pad.

13. The method according to claim 12, wherein the active layer has an interface with the top surface of the first pad and with the annular area of the second pad.

14. The method according to claim 13, wherein removing the first sacrificial material creates a void laterally delineated by the active layer.

15. A method for producing a structure on a substrate successively comprising:
   depositing a second sacrificial material;
   depositing a first sacrificial material, the first sacrificial material being different from the second sacrificial material;
   after depositing the second and first sacrificial materials, patterning the first sacrificial material to form a first pad of first sacrificial material on the second sacrificial material and then patterning the second sacrificial material to form a second pad of second sacrificial material, so that the first pad of first sacrificial material is arranged on a top surface of the second pad of second sacrificial material, the top surface of the second pad having a free surface around the first pad;
   depositing an active layer made of a first material, the active layer covering at least a whole of side walls of the first and second pads and said surface around the first pad;

patterning the active layer to allow access to the first pad;

removing the first pad so as to release a free area of the active layer, the free area being secured to the substrate by a securing area made of the active layer; and removing the second pad after the first pad has been removed to access the substrate.

16. A method for producing a structure on a substrate successively comprising:

providing the substrate with a first pattern of first sacrificial material and a second pattern of second sacrificial material, the first pattern being separated from the substrate by the second pattern, the first and second patterns presenting sidewalls connecting a top face of the pattern with a bottom face of the pattern, the first pattern defining an annular area devoid of the first sacrificial material on a top face of the second pattern around the first pattern and extending from the sidewalls of the first pattern to the sidewalls of the second pattern;

depositing an active layer so as to cover the sidewalls of the first and second patterns, the annular area and the top face of the first pattern;

patterning the active layer to access the first pattern, the annular area and the sidewalls of the second pattern being covered by the active layer;

removing the first sacrificial material selectively versus the second sacrificial material so as to release a free area of the active layer, the free area being secured to the substrate by a securing area made of the active layer; and removing the second sacrificial material after the first sacrificial material has been removed.

* * * * *